(12) United States Patent
Fujii et al.

(10) Patent No.: US 11,575,361 B2
(45) Date of Patent: Feb. 7, 2023

(54) RESONATOR DEVICE, RESONATOR MODULE, ELECTRONIC APPARATUS, AND VEHICLE

(71) Applicant: SEIKO EPSON CORPORATION, Tokyo (JP)

(72) Inventors: Masahiro Fujii, Shiojiri (JP); Ryuichi Kurosawa, Hara-mura (JP)

(73) Assignee: SEIKO EPSON CORPORATION, Tokyo (JP)

( * ) Notice: Subject to any disclaimer, the term of this patent is extended or adjusted under 35 U.S.C. 154(b) by 406 days.

(21) Appl. No.: 16/776,659

(22) Filed: Jan. 30, 2020

(65) Prior Publication Data

US 2020/0252047 A1 Aug. 6, 2020

(30) Foreign Application Priority Data

Jan. 31, 2019 (JP) .............................. JP2019-016275

(51) Int. Cl.
*H03H 9/17* (2006.01)
*H03H 9/10* (2006.01)
*H01L 41/053* (2006.01)

(52) U.S. Cl.
CPC ........... *H03H 9/17* (2013.01); *H01L 41/0533* (2013.01); *H03H 9/10* (2013.01)

(58) Field of Classification Search
CPC .......................................................... H03H 9/17

USPC ......................................................... 310/348
See application file for complete search history.

(56) References Cited

U.S. PATENT DOCUMENTS 8,698,376 B2 * 4/2014 Chen ................. H03H 9/02007
310/309
2014/0203424 A1 7/2014 Shimanouchi

FOREIGN PATENT DOCUMENTS

| JP | H10-092702 A | 4/1998 |
| JP | 2004-128591 A | 4/2004 |
| JP | 2004-214787 A | 7/2004 |
| JP | 2008-207221 A | 9/2008 |
| JP | 2010-081415 A | 4/2010 |
| JP | 2011-187867 A | 9/2011 |
| WO | 2013/076830 A1 | 5/2013 |
| WO | 2016/084425 A1 | 6/2016 |

* cited by examiner

*Primary Examiner* — Joseph Chang
(74) *Attorney, Agent, or Firm* — Rankin, Hill & Clark LLP

(57) ABSTRACT

A resonator device includes a base substrate that is formed of a single crystal semiconductor and includes a first surface, a resonator element attached to the first surface of the base substrate, and a cover that is bonded to the first surface of the base substrate, accommodates the resonator element between the cover and the base substrate, and is formed of a single crystal semiconductor. The base substrate and the cover are bonded through an amorphous layer.

10 Claims, 14 Drawing Sheets

RESONATOR DEVICE, RESONATOR MODULE, ELECTRONIC APPARATUS, AND VEHICLE

The present application is based on, and claims priority from JP Application Serial Number 2019-016275, filed Jan. 31, 2019, the disclosure of which is hereby incorporated by reference herein in its entirety.

BACKGROUND

1. Technical Field

The present disclosure relates to a resonator device, a resonator module, an electronic apparatus, a vehicle, and a manufacturing method for a resonator device.

2. Related Art

JP-A-2010-81415 discloses a resonator device including a package and a piezoelectric resonator element accommodated in the package. The package includes a cavity having a recess portion open on the upper surface of the package, and a cover that is bonded to the upper surface of the cavity and closes the opening of the recess portion. The cavity and the cover are bonded by surface activated bonding.

However, in the surface activated bonding, an area in which the cavity and the cover are not bonded with sufficient strength may be likely to occur, and the bonding strength between the cavity and the cover may be likely to be decreased.

SUMMARY

A resonator device according to an application example includes a base substrate that is formed of a single crystal semiconductor and includes a first surface, a resonator element attached to the first surface of the base substrate, and a cover that is formed of a single crystal semiconductor and is bonded to the first surface of the base substrate to accommodate the resonator element between the cover and the base substrate. The base substrate and the cover are bonded through an amorphous layer.

A resonator module according to another application example includes the resonator device.

An electronic apparatus according to another application example includes the resonator device.

A vehicle according to another application example includes the resonator device.

A manufacturing method for a resonator device according to another application example includes attaching a resonator element to a base substrate formed of a single crystal semiconductor, forming a first amorphous layer by irradiating the base substrate with inert gas and forming a second amorphous layer by irradiating a cover formed of a single crystal semiconductor with inert gas, and bonding the first amorphous layer to the second amorphous layer and accommodating the resonator element between the cover and the base substrate.

DESCRIPTION OF EXEMPLARY EMBODIMENTS

Hereinafter, a resonator device, a resonator module, an electronic apparatus, a vehicle and a manufacturing method for a resonator device according to the present application example will be described in detail based on embodiments illustrated in the appended drawings.

First Embodiment

Figure 1:
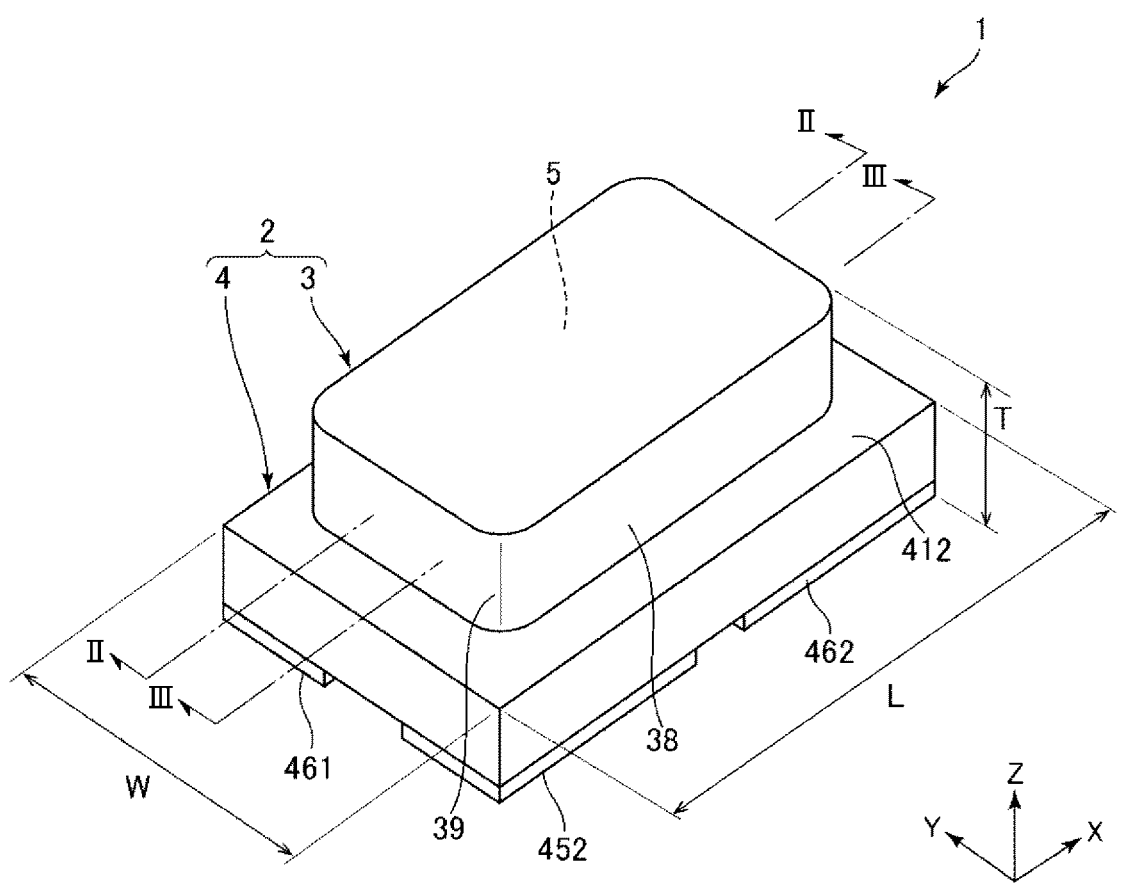
FIG. 1 is a perspective view illustrating a resonator device according to a first embodiment.
Figure 2:
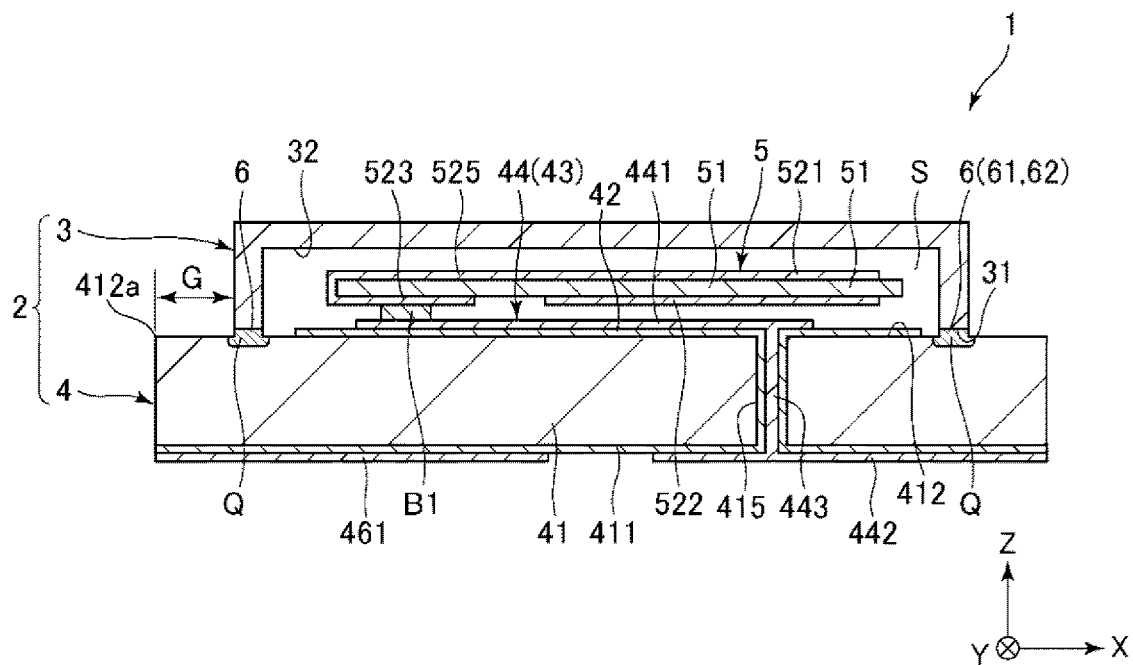
FIG. 2 is a II-II sectional view of FIG. 1.
Figure 3:
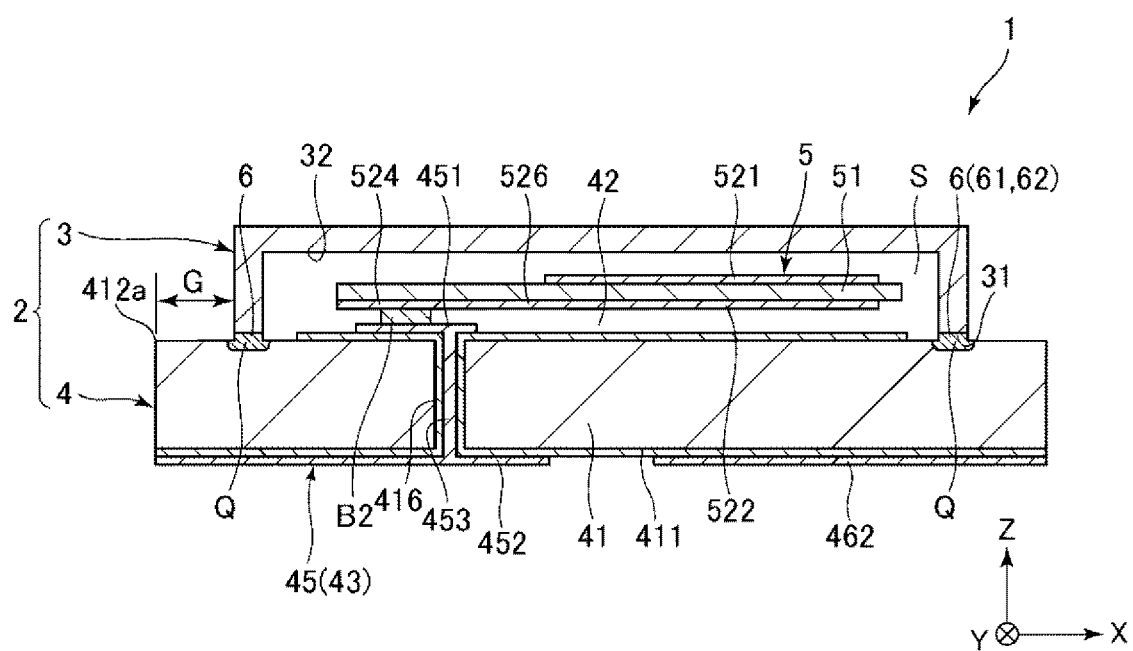
FIG. 3 is a III-III sectional view of FIG. 1.
Figure 4:
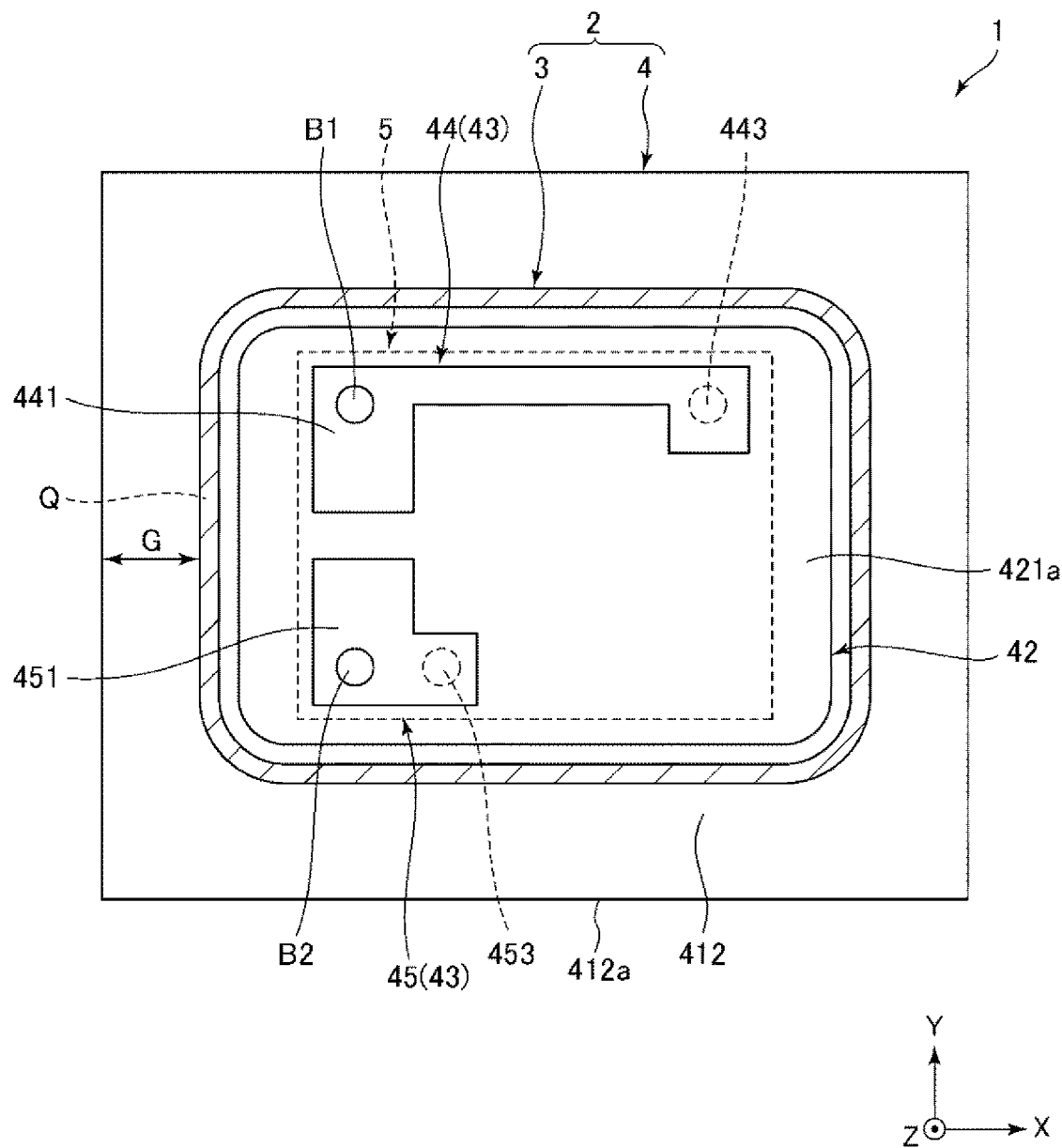
FIG. 4 is a plan view of the resonator device illustrated in FIG. 1.
Figure 5:
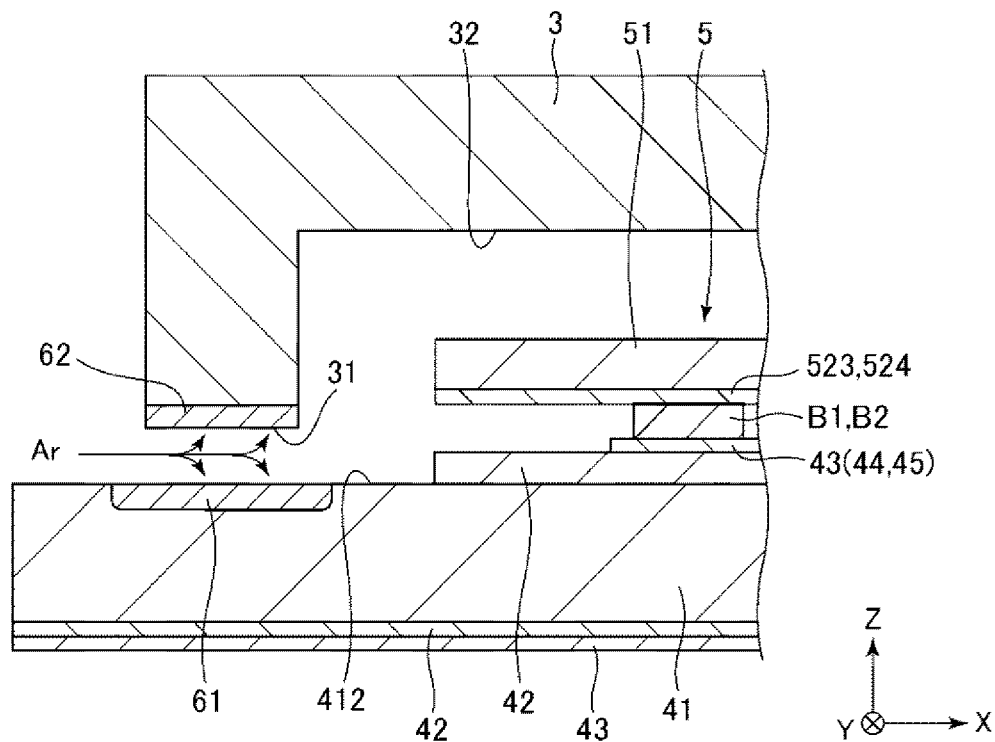
FIG. 5 is a sectional view illustrating a bonding method for a base substrate and a lid.
Figure 6:
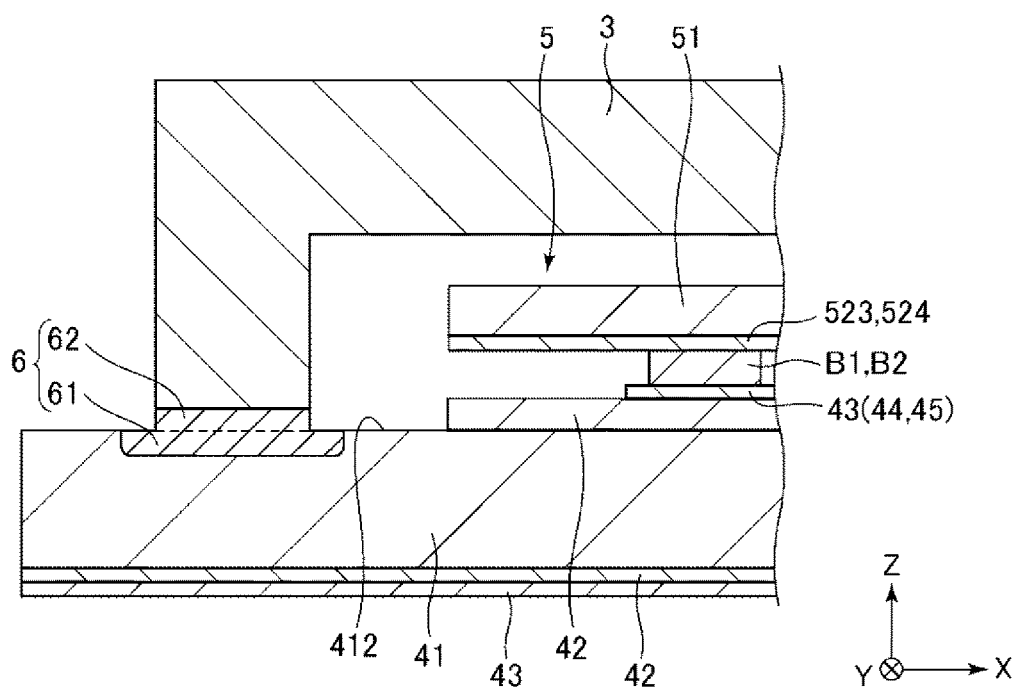
FIG. 6 is a sectional view illustrating the bonding method for the base substrate and the lid.
Figure 7:
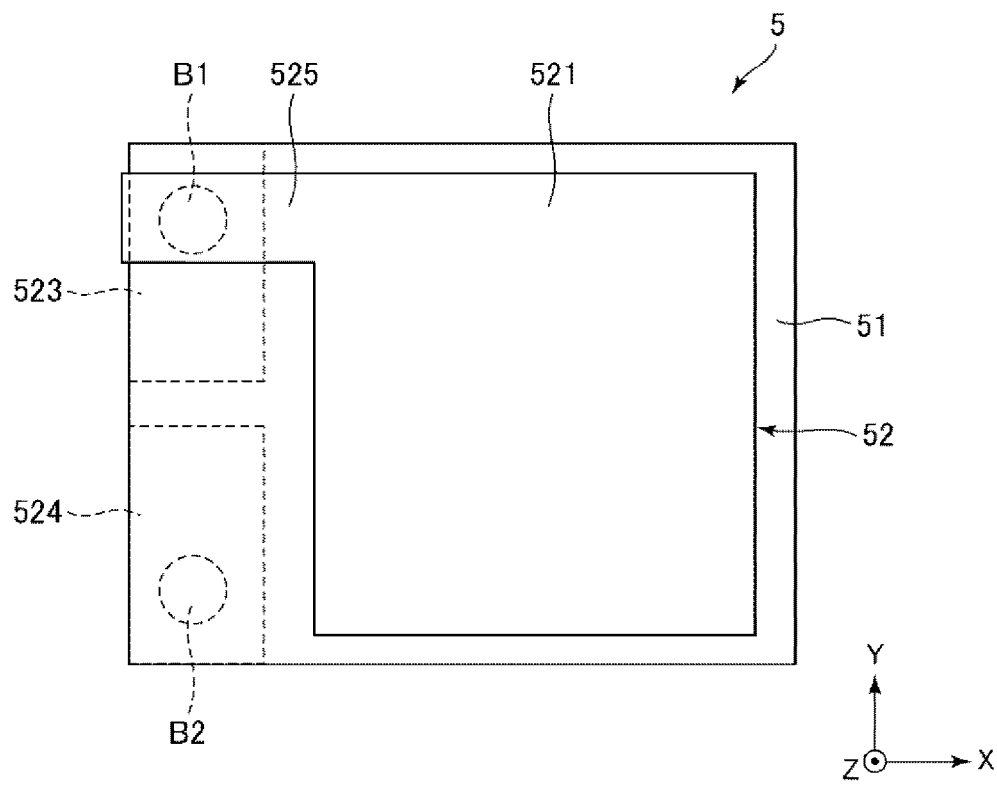
FIG. 7 is a plan view of a resonator element.
Figure 8:
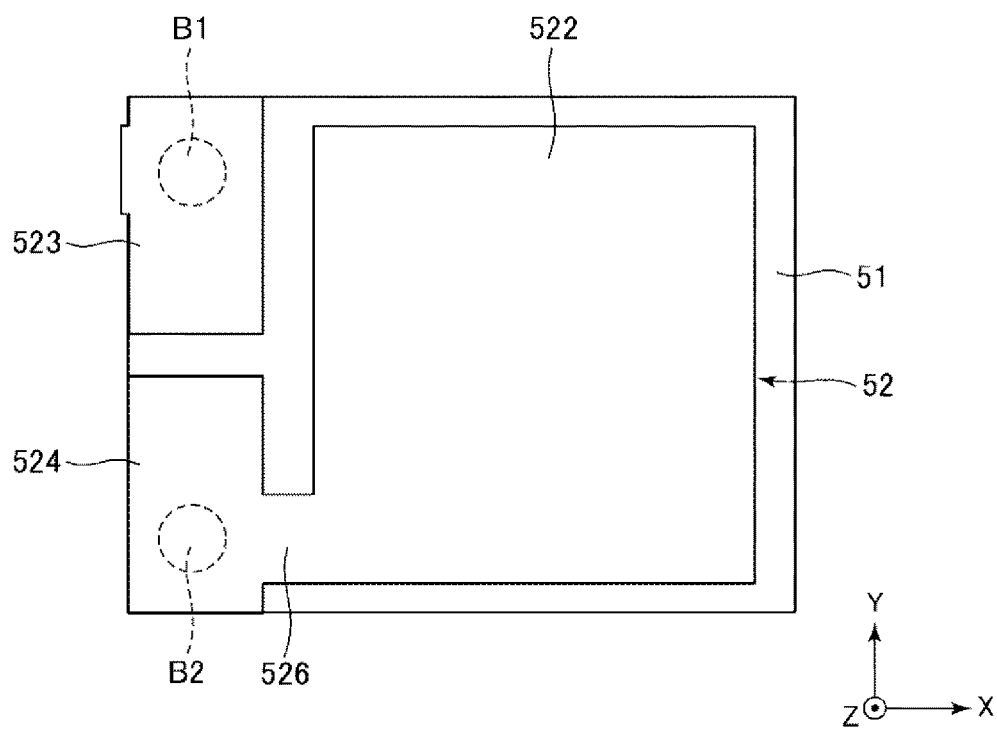
FIG. 8 is a see-through view of the resonator element seen from above.
Figure 9:
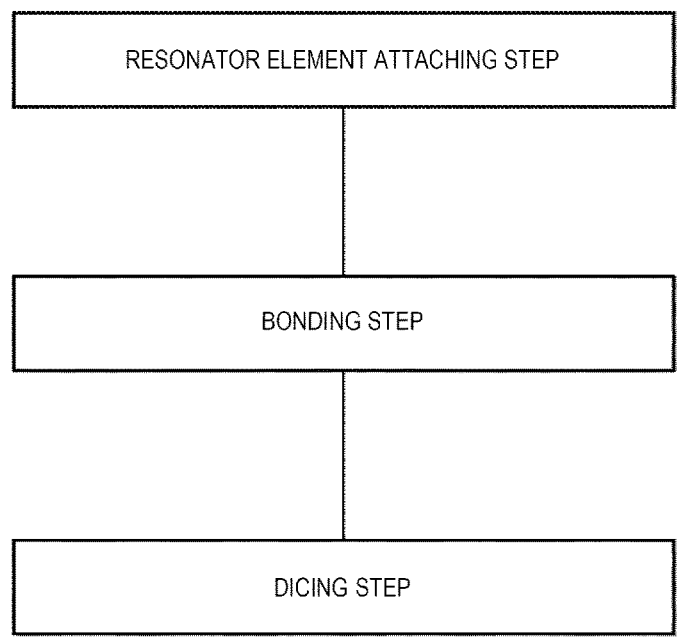
FIG. 9 is a diagram illustrating a manufacturing step of the resonator device.

FIG. 1 is a perspective view illustrating a resonator device according to a first embodiment. FIG. 2 is a II-II sectional view of FIG. 1. FIG. 3 is a III-III sectional view of FIG. 1. FIG. 4 is a plan view of the resonator device illustrated in FIG. 1. FIG. 5 and FIG. 6 are sectional views illustrating a bonding method for a base substrate and a lid. FIG. 7 is a plan view of a resonator element. FIG. 8 is a see-through view of the resonator element seen from above. FIG. 9 is a diagram illustrating a manufacturing step of the resonator device. FIG. 10 to FIG. 17 are perspective views illustrating the manufacturing step of the resonator device.

For convenience of description, three axes that are orthogonal to each other are illustrated as an X axis, a Y axis, and a Z axis in each drawing. In FIG. 2 and FIG. 4, the positive side of the Z axis denotes the "top", and the negative side of the Z axis denotes the "bottom". A plan view from the thickness direction of the base substrate, that is, a plan view along the Z axis, is simply referred to as a "plan view".

For example, it is assumed that a resonator device 1 illustrated in FIG. 1 is a small size resonator device of which a length L×width W×height T is approximately 1.0 mm×0.8 mm×0.25 mm. However, the size of the resonator device 1 is not particularly limited.

As illustrated in FIG. 1, the resonator device 1 includes a resonator element 5 and a package 2 accommodating the resonator element 5. As illustrated in FIG. 2 and FIG. 3, the package 2 includes a lid 3 that is a cover of a box shape including a recess portion 32 accommodating the resonator element 5, and a base 4 of a plate shape that covers the opening of the recess portion 32 and is bonded to the lid 3. By covering the opening of the recess portion 32 with the base 4, an accommodation space S in which the resonator element 5 is accommodated is formed. The accommodation space S is airtight and is in a depressurized state or may be in a state closer to a vacuum. Accordingly, viscous resistance is decreased, and the resonator element 5 can be stably driven. The atmosphere of the accommodation space S is not particularly limited and may be, for example, an atmosphere in which inert gas such as nitrogen or Ar is sealed, or may be in an atmospheric state or a pressurized state other than the depressurized state.

The base 4 includes a base substrate 41 of a plate shape, an insulating film 42 arranged on the surface of the base substrate 41, and an electrode 43 arranged on the insulating film 42. The base substrate 41 has a plate shape of which the plan view shape is a rectangle, and includes a lower surface 411 and an upper surface 412 that are in a front-rear relationship with each other. In addition, the base substrate 41 includes two through holes 415 and 416 that pass through the upper surface 412 and the lower surface 411.

The base substrate 41 is formed of a single crystal semiconductor. The single crystal semiconductor is not particularly limited. For example, single crystal silicon (Si), single crystal germanium (Ge), single crystal GaP, single crystal GaAs, and single crystal InP can be used. Particularly, in the present embodiment, the base substrate 41 is formed of single crystal silicon. Accordingly, the base substrate 41 is more inexpensive and is easily obtained. The crystal orientation of the upper surface 412 is not particularly limited. In the present embodiment, the upper surface 412 is configured as a (100) surface.

The insulating film 42 is arranged on the surface of the base substrate 41. However, the insulating film 42 is not formed in a bonding area Q between the base substrate 41 and the lid 3 on the upper surface 412 of the base substrate 41. That is, in the bonding area Q, single crystal silicon constituting the upper surface 412 is exposed from the insulating film 42. The insulating film 42 is not particularly limited. In the present embodiment, a silicon oxide film ($SiO_2$ film) is used. A forming method for the insulating film 42 is not particularly limited. For example, the insulating film 42 may be formed by subjecting the surface of the base substrate 41 to thermal oxidation, or may be formed by plasma CVD using tetraethoxysilane (TEOS).

The electrode 43 is arranged on the insulating film 42. The electrode 43 includes a first interconnect 44 and a second interconnect 45 that are insulated by the insulating film 42. The first interconnect 44 includes an internal terminal 441 positioned on the upper surface 412 side, that is, inside the accommodation space S, an external terminal 442 positioned on the lower surface 411 side, that is, outside the accommodation space S, and a through electrode 443 that is formed in the through hole 415 and electrically couples the internal terminal 441 to the external terminal 442. Similarly, the second interconnect 45 includes an internal terminal 451 positioned on the upper surface 412 side, an external terminal 452 positioned on the lower surface 411 side, and a through electrode 453 that is formed in the through hole 416 and electrically couples the internal terminal 451 to the external terminal 452. In addition, the electrode 43 includes two dummy electrodes 461 and 462 arranged on the lower surface 411 side.

The lid 3 has a box shape and includes the bottomed recess portion 32 that is open on a lower surface 31. As illustrated in FIG. 4, the plan view shape of the lid 3 is a rectangle almost similar to the upper surface 412 of the base substrate 41, and is formed to be slightly smaller than the upper surface 412. That is, in plan view, the outer edge of the lid 3 does not overlap with an outer edge 412a of the upper surface 412 and is positioned inside the outer edge 412a.

The lid 3 is formed of a single crystal semiconductor. The single crystal semiconductor is not particularly limited. For example, single crystal silicon (Si), single crystal germanium (Ge), single crystal GaP, single crystal GaAs, and single crystal InP can be used. Particularly, in the present embodiment, the lid 3 is formed of single crystal silicon. Accordingly, the lid 3 is more inexpensive and is easily obtained. The crystal orientation of the lower surface 31 is not particularly limited. In the present embodiment, the lower surface 31 is configured as the (100) surface. By forming the lid 3 of single crystal silicon, the materials of the base substrate 41 and the lid 3 can be matched, and a difference in coefficient of thermal expansion between the materials can be substantially equal to zero. Thus, the occurrence of thermal stress caused by thermal expansion is reduced, and the resonator device 1 has excellent resonance characteristics. In addition, the affinity between the base substrate 41 and the lid 3 is increased, and the base substrate 41 and the lid 3 can be bonded with higher strength.

The lid 3 is directly bonded to the upper surface 412 of the base substrate 41 through an amorphous layer 6 on the lower surface 31. In plan view, the bonding area Q of the amorphous layer 6 is formed at the whole periphery of the lower surface 31. As will be described in the manufacturing method later, first, as illustrated in FIG. 5, a first amorphous layer 61 of which the surface is activated is formed by irradiating the upper surface 412 of the base substrate 41 with argon gas which is inert gas, and breaking the crystal structure of silicon in the part. Similarly, a second amorphous layer 62 of which the surface is activated is formed by irradiating the lower surface 31 of the lid 3 with argon gas which is inert gas, and breaking the crystal structure of silicon in the part. Then, as illustrated in FIG. 6, the amorphous layer 6 is formed by surface activated bonding of the first and second amorphous layers 61 and 62. The base substrate 41 and the lid 3 are bonded through the amorphous layer 6. According to this bonding method, the base substrate 41 and the lid 3 can be bonded with sufficient strength at room temperature. In addition, internal stress is unlikely to remain in the package 2, and thermal damage to the resonator element 5 is reduced.

In addition, by directly bonding the lid 3 to the base substrate 41 through the amorphous layer 6, for example, the lid 3 and the base substrate 41 can be bonded more stably with more sufficient bonding strength than when the surfaces of single crystal silicon are directly bonded. Specifically, when the lower surface 31 of the lid 3 and the upper surface 412 of the base substrate 41 are bonded by surface activated bonding of single crystal silicon, significantly high bonding strength can be implemented in a case where the lower surface 31 of the lid 3 is ideally bonded to the upper surface 412 of the base substrate 41. However, the surface activated bonding of single crystal silicon is likely to be affected by the surface roughness of the bonding surfaces, a foreign object attached between the bonding surfaces, and the like. It is very difficult to perform ideal bonding. That is, when bonding is well performed, higher bonding strength than the bonding through the amorphous layer 6 in the present embodiment may be exhibited. However, the possibility of well performing bonding is low, and a bonding defect is likely to occur. Thus, production is not stable, and a yield is low.

Meanwhile, when bonding is performed through the amorphous layer 6 as in the present embodiment, bonding can be performed with sufficiently high strength even in a case where the surfaces of the bonding surfaces are slightly rough or a foreign object is attached between the bonding surfaces. In addition, air tightness of the bonding portion can be secured. That is, the permissible range of a bonding condition is wider than bonding between single crystal silicon. Thus, production is stable, and the lid 3 and the base substrate 41 can be bonded with sufficiently high strength.

As illustrated in FIG. 2 to FIG. 4, the bonding area Q between the base substrate 41 and the lid 3 is positioned inside the outer edge 412a of the upper surface 412 in plan view. That is, a gap G is formed between the bonding area Q and the outer edge 412a. By arranging the bonding area Q at a position close to the center away from the outer edge 412a without an overlap between the bonding area Q and the outer edge 412a, external stress is unlikely to be applied to the bonding area Q. As a specific example, for example, when the resonator device 1 hits the ground by falling down, the bonding area Q does not directly come into contact with the ground. Thus, the bonding area Q does not directly receive impact caused by falling down. Accordingly, excessive stress is unlikely to be applied to the bonding area Q, and a decrease in strength or breakage of the bonding area Q can be effectively reduced.

The gap G is not particularly limited. For example, as described above, when the size of the resonator device 1 is approximately length L×width W=1.2 mm×1.0 mm, the gap G can be approximately greater than or equal to 0.01 mm and less than or equal to 0.05 mm. In the present embodiment, the whole area of the bonding area Q is positioned inside the outer edge 412a. However, the present embodiment is not for limitation purposes. A part of the bonding area Q may overlap with the outer edge 412a. In this case, the area in overlap with the outer edge 412a may be less than or equal to 30%, more desirably less than or equal to 20%, and further desirably less than or equal to 10% of the whole area.

The bonding area Q between the base substrate 41 and the lid 3 is not for limitation purposes. For example, the bonding area Q may overlap with the outer edge 412a of the upper surface 412 in plan view. In other words, the side surface of the base substrate 41 and the side surface of the lid 3 may be planar, that is, G=0.

As illustrated in FIG. 7 and FIG. 8, the resonator element 5 includes a resonator substrate 51 and an electrode 52 arranged on the surface of the resonator substrate 51. The resonator substrate 51 has a thickness shear resonation mode and is formed of an AT cut quartz crystal substrate in the present embodiment. The AT cut quartz crystal substrate has three-dimensional frequency-temperature characteristics and is used as the resonator element 5 having excellent temperature characteristics.

The electrode 52 includes an excitation electrode 521 arranged on the upper surface of the resonator substrate 51 and an excitation electrode 522 arranged on the lower surface of the resonator substrate 51 in opposition to the excitation electrode 521 through the resonator substrate 51. In addition, the electrode 52 includes a pair of terminals 523 and 524 arranged on the lower surface of the resonator substrate 51, an interconnect 525 electrically coupling the terminal 523 to the excitation electrode 521, and an interconnect 526 electrically coupling the terminal 524 to the excitation electrode 522.

The configuration of the resonator element 5 is not limited to the above configuration. For example, the resonator element 5 may be of a mesa type in which a resonance area interposed between the excitation electrodes 521 and 522 protrudes from the surrounding area of the resonance area. Conversely, the resonator element 5 may be of an inverted mesa type in which the resonance area recessed from the surrounding area of the resonance area. In addition, a bevel process of grinding the surrounding area of the resonator substrate 51, or a convex process of forming the upper surface and the lower surface of the resonator substrate 51 into convex surfaces may be performed.

The resonator element 5 that resonates in the thickness shear resonance mode is not for limitation purposes. For example, the resonator element 5 may be a tuning fork type resonator element of which two vibrating arms are subjected to tuning fork resonance in an in-plane direction. That is, the resonator substrate 51 is not limited to the AT cut quartz crystal substrate and may be a quartz crystal substrate other than the AT cut quartz crystal substrate such as an X cut quartz crystal substrate, a Y cut quartz crystal substrate, a Z cut quartz crystal substrate, a BT cut quartz crystal substrate, an SC cut quartz crystal substrate, or an ST cut quartz crystal substrate. In the present embodiment, the resonator substrate 51 is formed of quartz crystal. However, the present embodiment is not for limitation purposes. For example, the resonator substrate 51 may be formed of a piezoelectric single crystal such as lithium niobate, lithium tantalate, lithium tetraborate, langasite, potassium niobate, or gallium phosphate, or may be formed of other piezoelectric single crystals. Furthermore, the resonator element 5 is not limited to the piezoelectric drive type resonator element and may be an electrostatic drive type resonator element that uses electrostatic force.

As illustrated in FIG. 2 and FIG. 3, the resonator element 5 is fixed on the upper surface of the base 4 by conductive bonding members B1 and B2. The conductive bonding member B1 electrically couples the internal terminal 441 of the base 4 to the terminal 523 of the resonator element 5. The conductive bonding member B2 electrically couples the internal terminal 451 of the base 4 to the terminal 524 of the resonator element 5.

The conductive bonding members B1 and B2 are not particularly limited as long as the conductive bonding members B1 and B2 have both conductivity and bondability. For example, various metal bumps such as a gold bump, a silver bump, a copper bump, and a solder bump, and conductive adhesives obtained by dispersing a conductive filler such as a silver filler into various polyimide-based, epoxy-based, silicone-based, and acrylic-based adhesives can be used. When the former metal bumps are used as the conductive bonding members B1 and B2, the occurrence of gas from the conductive bonding members B1 and B2 can be reduced, and an environmental change in the accommodation space S, particularly, an increase in pressure, can be effectively reduced. Meanwhile, when the latter conductive adhesives are used as the conductive bonding members B1 and B2, the conductive bonding members B1 and B2 are softer than the metal bumps, and stress is unlikely to occur in the resonator element 5.

The resonator device 1 is described thus far. As described above, the resonator device 1 includes the base substrate 41 that is formed of a single crystal semiconductor and includes the upper surface 412 which is a first surface, the resonator element 5 attached to the upper surface 412 side of the base substrate 41, and the lid 3 as a cover that is formed of a single crystal semiconductor and is bonded to the upper surface 412 of the base substrate 41 such that the resonator element 5 is accommodated between the lid 3 and the base substrate 41. The base substrate 41 and the lid 3 are bonded through the amorphous layer 6. By bonding the base substrate 41 and the lid 3 through the amorphous layer 6, the lid 3 and the base substrate 41 can be bonded more stably with sufficient bonding strength.

As described above, the base substrate 41 and the lid 3 are formed of the same material, that is, the same type of single crystal semiconductor. Accordingly, a difference in coefficient of thermal expansion between the base substrate 41 and the lid 3 can be substantially equal to zero. Thus, the occurrence of thermal stress caused by thermal expansion is reduced, and the resonator device 1 has excellent resonance characteristics. In addition, the affinity between the base substrate 41 and the lid 3 is increased, and the base substrate 41 and the lid 3 can be bonded with higher strength.

As described above, the single crystal semiconductor constituting the base substrate 41 and the lid 3 is single crystal silicon. Accordingly, the base substrate 41 and the lid 3 are inexpensive and are easily obtained. The bonding between both of the base substrate 41 and the lid 3 by the amorphous layer 6 is more secured. In addition, excellent processing accuracy can be exhibited.

As described above, the lid 3 includes the recess portion 32 that is open on the base substrate 41 side and accommodates the resonator element 5. The opening of the recess portion 32 is closed with the base substrate 41. Accordingly, the resonator element 5 can be accommodated using a simple configuration. In addition, the resonator element 5 can be protected by the package 2 configured with the base substrate 41 and the lid 3, and the resonator device 1 has high mechanical strength.

As described above, the bonding area Q between the base substrate 41 and the lid 3 is positioned inside the outer edge 412a of the upper surface 412. Accordingly, excessive stress is unlikely to be applied to the bonding area Q, and a decrease in strength or breakage of the bonding area Q can be effectively reduced.

Next, a manufacturing method for the resonator device 1 will be described. As illustrated in FIG. 9, the manufacturing method for the resonator device 1 includes a resonator element attaching step of preparing a base wafer 400 including a plurality of integrated bases 4 and attaching the resonator element 5 to each base 4, a bonding step of bonding a lid wafer 300 including a plurality of integrated lids 3 to the base wafer 400 and forming a device wafer 100 including a plurality of integrated resonator devices 1, and a dicing step of dicing the plurality of resonator devices 1 from the device wafer 100. Hereinafter, the manufacturing method will be described based on FIG. 10 to FIG. 18. FIG. 10 to FIG. 18 are sectional views corresponding to FIG. 2.

Resonator Element Attaching Step

Figure 10:
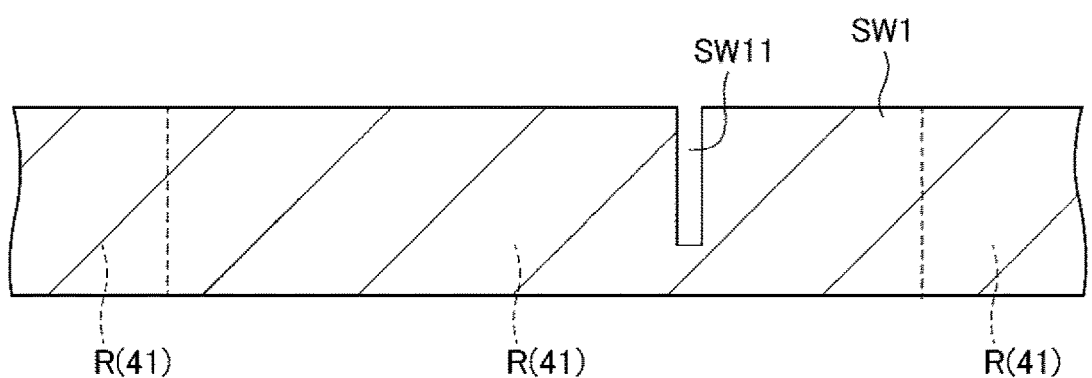
FIG. 10 is a sectional view illustrating the manufacturing step of the resonator device.
Figure 11:
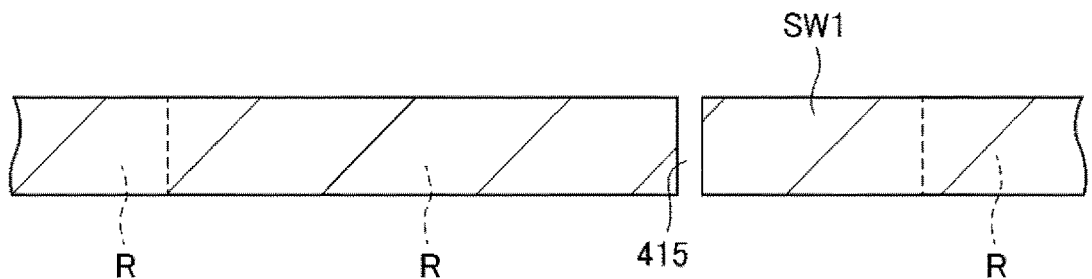
FIG. 11 is a sectional view illustrating the manufacturing step of the resonator device.

First, as illustrated in FIG. 10, a single crystal silicon wafer SW1 that is a base material of the base substrate 41 is prepared. In the single crystal silicon wafer SW1, a plurality of dicing areas R each of which forms one base substrate 41 by a dicing step described later are arranged in a matrix. Next, in each dicing area R, two bottomed recess portions SW11 are formed from the upper surface side of the silicon wafer SW1. For example, the recess portion SW11 can be formed by dry etching represented by the Bosch process. Next, as illustrated in FIG. 11, the single crystal silicon wafer SW1 is ground and polished from the lower surface side of the single crystal silicon wafer SW1. The single crystal silicon wafer SW1 is thinned until the recess portion SW11 passes through the single crystal silicon wafer SW1. Accordingly, the through holes 415 and 416 are formed in each dicing area R.

Figure 12:
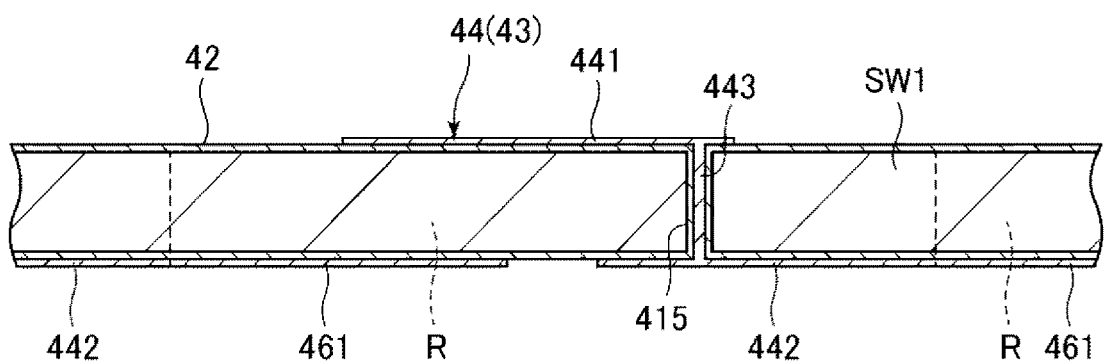
FIG. 12 is a sectional view illustrating the manufacturing step of the resonator device.

Next, as illustrated in FIG. 12, the insulating film 42 that is formed with a silicon oxide film is formed on the surface of the single crystal silicon wafer SW1. Furthermore, the electrode 43 is formed on the insulating film 42 in each dicing area R. For example, the insulating film 42 can be formed by thermal oxidation or a plasma CVD method using TEOS. The electrode 43 can be formed by depositing a metal film on the insulating film 42 by vapor deposition or sputtering and patterning the metal film by etching.

Figure 13:
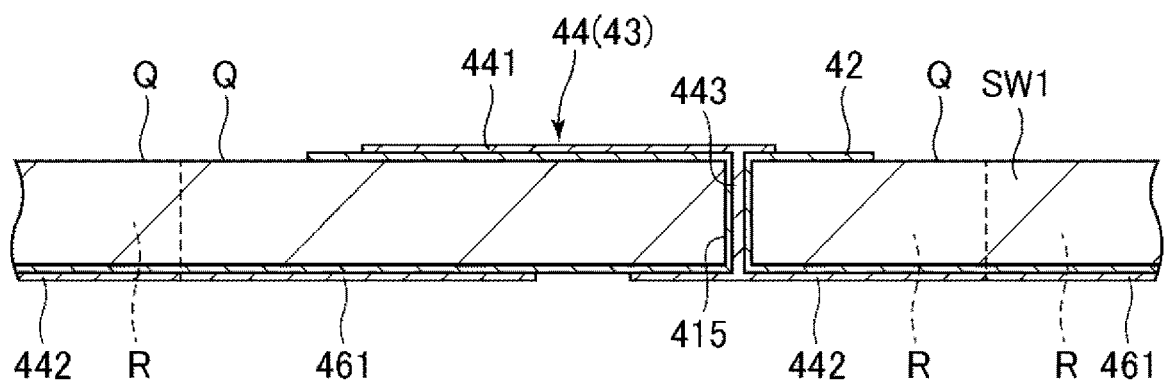
FIG. 13 is a sectional view illustrating the manufacturing step of the resonator device.
Figure 14:
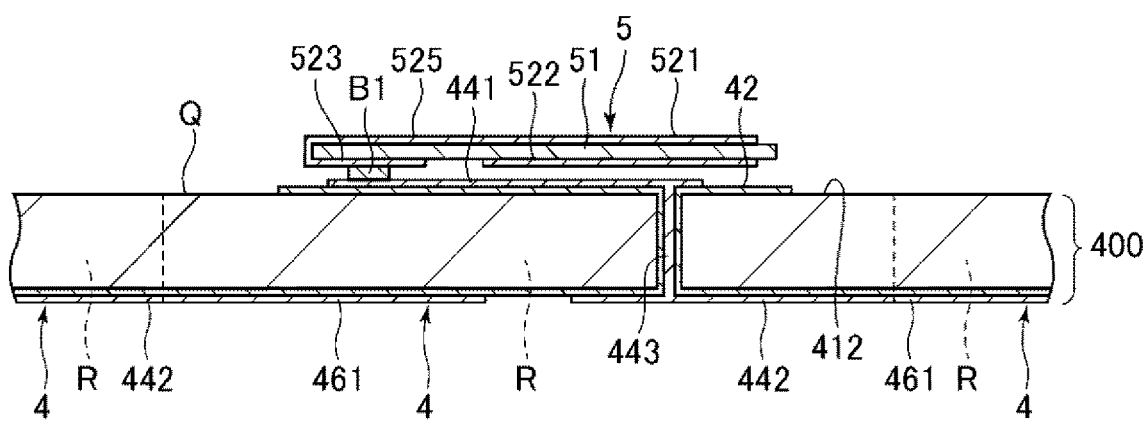
FIG. 14 is a sectional view illustrating the manufacturing step of the resonator device.

Next, as illustrated in FIG. 13, a part of the insulating film 42 on the upper surface of the single crystal silicon wafer SW1 is removed, and the upper surface is exposed from the insulating film 42 in a part that is the bonding area Q with respect to the lid wafer 300. Through the steps described thus far, a base wafer 400 in which a plurality of bases 4 are integrated is obtained. Next, as illustrated in FIG. 14, the resonator element 5 is attached to the upper surface side of each base 4.

Bonding Step

Figure 15:
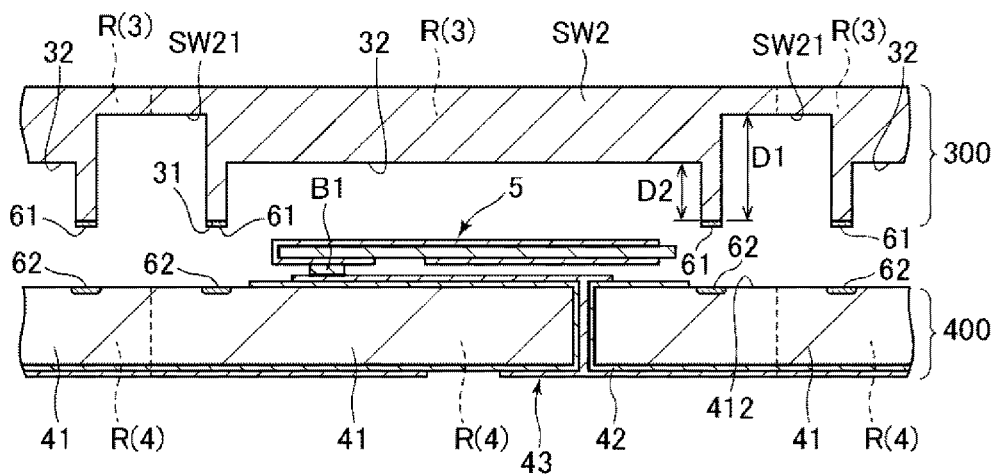
FIG. 15 is a sectional view illustrating the manufacturing step of the resonator device.

First, as illustrated in FIG. 15, a single crystal silicon wafer SW2 that is a base material of the lid 3 is prepared. In the single crystal silicon wafer SW2, a plurality of dicing areas R each of which forms one lid 3 by dicing described later are arranged in a matrix. Next, the bottomed recess portion 32 is formed in each dicing area R from the lower surface side of the silicon wafer SW2, and a recess portion SW21 is formed along a boundary between adjacent dicing areas R. For example, the recess portions 32 and SW21 can be formed by dry etching represented by the Bosch process. A depth D1 of the recess portion SW21 is greater than a depth D2 of the recess portion 32. Through the steps described thus far, a lid wafer 300 in which a plurality of lids 3 are integrated is obtained.

Figure 16:
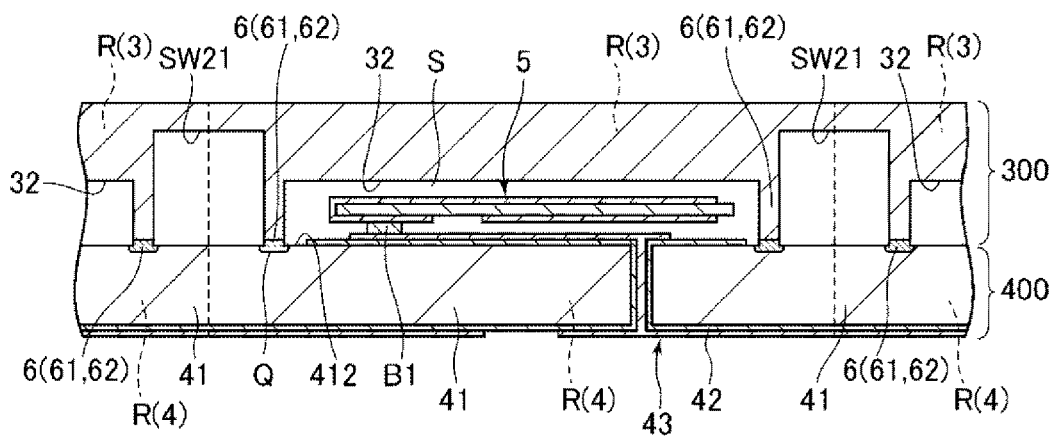
FIG. 16 is a sectional view illustrating the manufacturing step of the resonator device.

Next, the first amorphous layer 61 of which the surface is activated is formed by irradiating the upper surface 412 of each base substrate 41 with argon gas which is inert gas, and breaking the silicon crystal structure of the upper surface 412, that is, by amorphization. The second amorphous layer 62 of which the surface is activated is formed by irradiating the lower surface 31 of each lid 3 with argon gas which is inert gas, and breaking the silicon crystal structure of the lower surface 31, that is, by amorphization. Next, the base wafer 400 and the lid wafer 300 are aligned and overlaid. As illustrated in FIG. 16, the amorphous layer 6 is formed by bonding the activated surfaces of the first and second amorphous layers 61 and 62. The base wafer 400 and the lid wafer 300 are directly bonded through the amorphous layer 6. The inert gas is not limited to argon gas. For example, nitrogen gas may be used.

Figure 17:
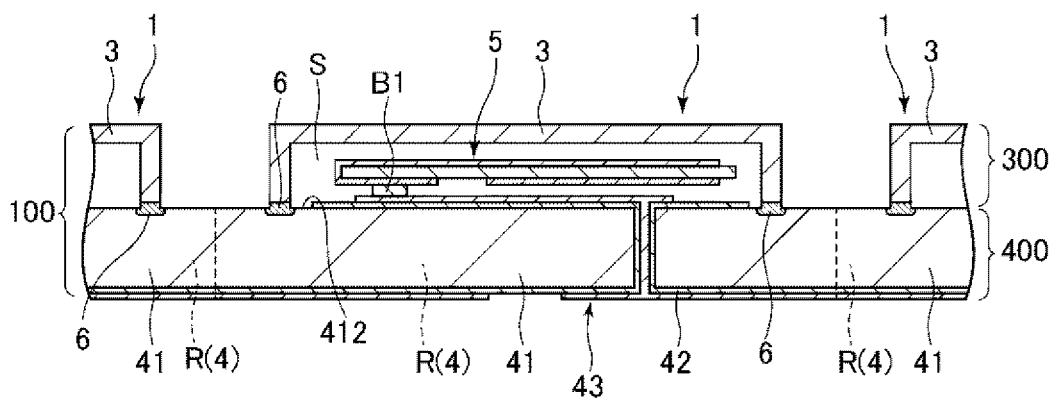
FIG. 17 is a sectional view illustrating the manufacturing step of the resonator device.

Next, as illustrated in FIG. 17, the lid wafer 300 is ground and polished from the upper surface side of the lid wafer 300, and the lid wafer 300 is thinned until the recess portion SW21 passes through the lid wafer 300. Accordingly, the lid 3 in each dicing area R is diced. Through the steps described thus far, a device wafer 100 in which a plurality of resonator devices 1 are integrated is obtained.

Dicing Step

Next, each resonator device 1 is diced from the device wafer 100 using a dicing blade. A dicing method is not particularly limited. Accordingly, a plurality of resonator devices 1 are manufactured at once.

The manufacturing method for the resonator device 1 is described thus far. The manufacturing method for the resonator device 1 includes a step of attaching the resonator element 5 to the base substrate 41 formed of a single crystal semiconductor, a step of forming the first amorphous layer 61 by irradiating the base substrate 41 with the inert gas, and forming the second amorphous layer 62 by irradiating the lid 3 as the cover formed of a single crystal semiconductor with the inert gas, and a step of bonding the first amorphous layer 61 to the second amorphous layer 62 and accommodating the resonator element 5 between the lid 3 and the base substrate 41. According to the manufacturing method, a high quality resonator device 1 having high mechanical strength can be easily manufactured. In addition, a plurality of resonator devices 1 having high mechanical strength can be manufactured at the same time.

Second Embodiment

Figure 18:
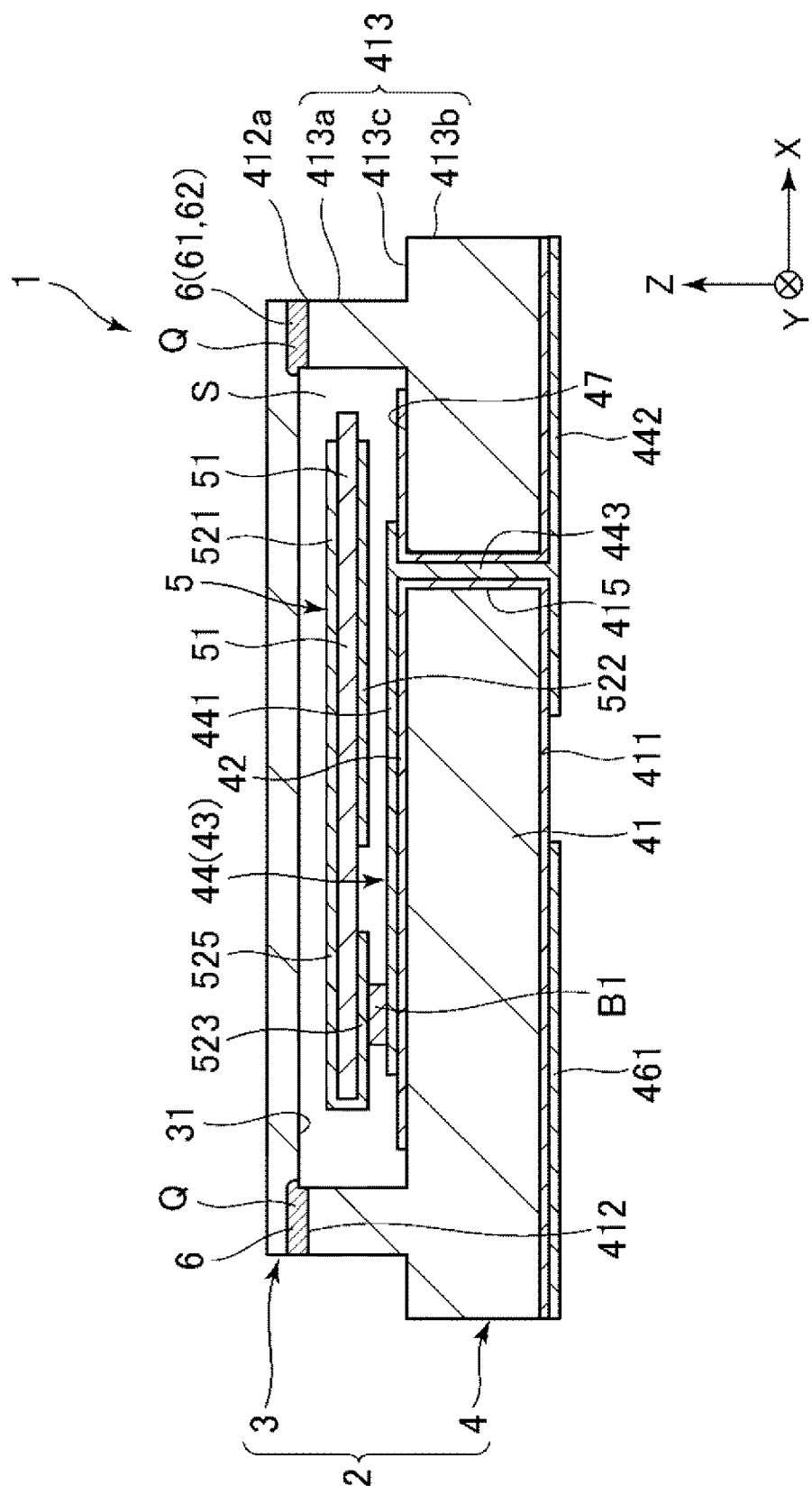
FIG. 18 is a sectional view illustrating a resonator device according to a second embodiment.

FIG. 18 is a sectional view illustrating a resonator device according to a second embodiment.

The resonator device 1 according to the present embodiment is the same as the resonator device 1 of the first embodiment except that the configuration of the package 2 is different. In the following description, differences between the resonator device 1 of the second embodiment and the first embodiment will be mainly described, and the same matters will not be described. In FIG. 18, the same configurations as the above embodiments are designated by the same reference signs.

In the resonator device 1 of the present embodiment, as illustrated in FIG. 18, the base substrate 41 includes a recess portion 47 that is open on the upper surface 412. The resonator element 5 is attached to the bottom portion of the recess portion 47. The lid 3 forms a plate shape, and the lower surface 31 of the lid 3 is bonded to the upper surface 412 of the base substrate 41 through the amorphous layer 6 such that the lid 3 closes the opening of the recess portion 47. By having such a configuration, the package 2 accommodating the resonator element 5 can be formed using a simple configuration.

In addition, the base substrate 41 includes a side surface 413 coupling the upper surface 412 to the lower surface 411. The side surface 413 includes a first part 413a that is positioned on the upper surface 412 side and is coupled to the upper surface 412, a second part 413b that is positioned on the lower surface 411 side and is coupled to the lower surface 411, and a third part 413c that is positioned between the first part 413a and the second part 413b and couples the first part 413a to the second part 413b. The first part 413a and the second part 413b are configured as surfaces perpendicular to the upper surface 412 and the lower surface 411, respectively. The third part 413c is configured as a surface parallel to the upper surface 412 and the lower surface 411. In plan view, the first part 413a is positioned inside the second part 413b. That is, in plan view, the side surface 413 includes the second part 413b and the third part 413c that are parts positioned outside the outer edge 412a of the upper surface 412.

By including the part positioned outside the outer edge 412a in the side surface 413, external stress is unlikely to be applied to the bonding area Q. Accordingly, a decrease in strength or breakage of the bonding area Q can be effectively reduced.

As described thus far, in the present embodiment, the base substrate 41 includes the recess portion 47 that is open on the upper surface 412 side and accommodates the resonator element 5. The opening of the recess portion 47 is closed with the lid 3. Accordingly, the resonator element 5 can be accommodated using a simple configuration. In addition, the resonator element 5 can be protected by the package 2 configured with the base substrate 41 and the lid 3, and the resonator device 1 has high mechanical strength.

As described above, the base substrate 41 includes the lower surface 411 that is a second surface in a front-rear relationship with the upper surface 412, and the side surface 413 coupling the upper surface 412 to the lower surface 411. In plan view of the base substrate 41, the side surface 413 includes the second part 413b and the third part 413c that are parts positioned outside the outer edge 412a of the upper surface 412. Accordingly, external stress is unlikely to be applied to the bonding area Q, and a decrease in strength or breakage of the bonding area Q can be effectively reduced.

According to the second embodiment, the same effect as the first embodiment can be exhibited. Particularly, in the present embodiment, strength with respect to stress applied along the X axis can be increased compared to the first embodiment, the shear strength of the resonator device 1 can be improved. In addition, low alignment accuracy at the time of bonding the lid 3 to the base substrate 41 may be allowed, and a particular effect such as simplification of the configuration of a bonding apparatus is achieved. In the present embodiment, the third part 413c is configured as a surface parallel to the upper surface 412. However, the present embodiment is not for limitation purposes. For example, the third part 413c may be an inclined surface inclined with respect to the upper surface 412 at less than 90°. Accordingly, a corner portion formed in a boundary portion between the first part 413a and the third part 413c, and a corner portion formed in a boundary portion between the second part 413b and the third part 413c can have obtuse angles, and the mechanical strength of the boundary portions can be increased.

Third Embodiment

Figure 19:
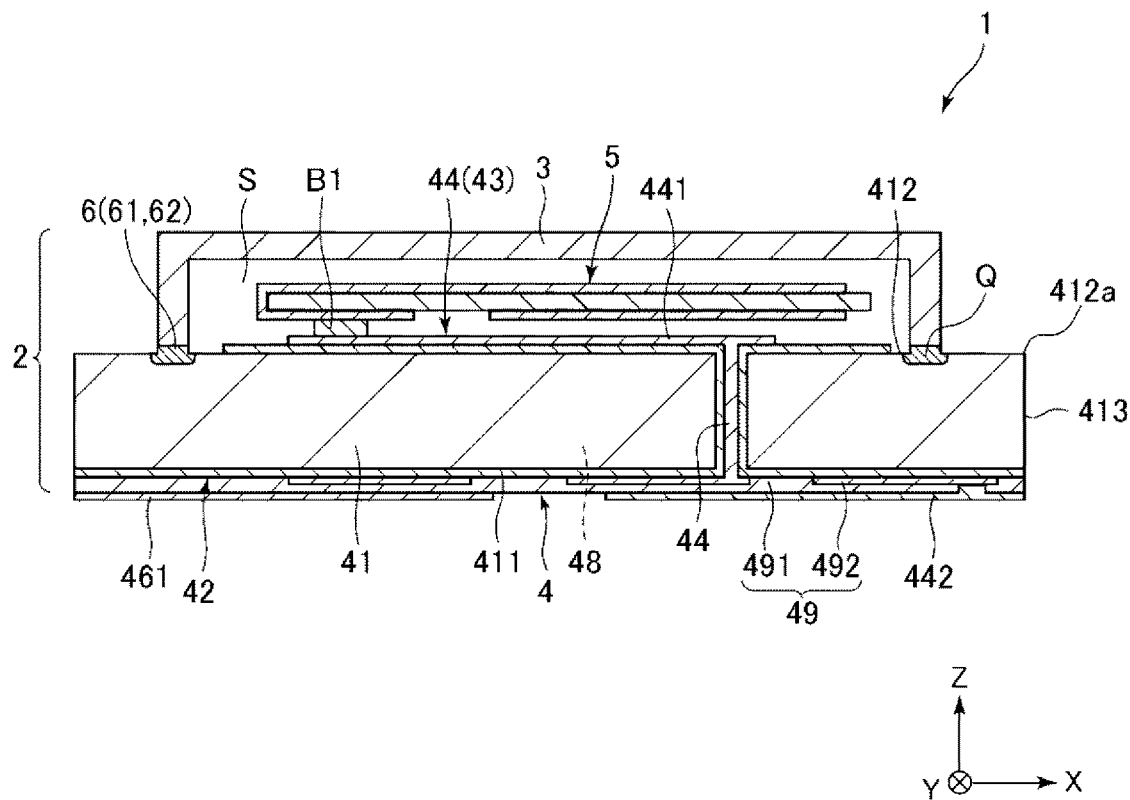
FIG. 19 is a sectional view illustrating a resonator device according to a third embodiment.

FIG. 19 is a sectional view illustrating a resonator device according to a third embodiment.

The resonator device 1 according to the present embodiment is the same as the resonator device 1 of the first embodiment except that an oscillation circuit 48 is formed in the base 4. In the following description, differences between the resonator device 1 of the second embodiment and the first embodiment will be mainly described, and the same matters will not be described. In FIG. 19, the same configurations as the above embodiments are designated by the same reference signs.

In the resonator device 1 of the present embodiment, as illustrated in FIG. 19, the oscillation circuit 48 electrically coupled to the resonator element 5 is formed in the base 4. In the present embodiment, the lower surface 411 of the base substrate 41 is set as an active surface. In addition, a stack 49 in which an insulating layer 491 and an interconnect layer 492 are stacked with each other is disposed on the lower surface 411 of the base substrate 41. A plurality of circuit elements, not illustrated, formed on the lower surface 411 are electrically coupled through the interconnect layer 492 and constitute the oscillation circuit 48. By forming the oscillation circuit 48 in the base 4, the space of the base 4 can be effectively used.

According to the third embodiment, the same effect as the first embodiment can be exhibited. In the present embodiment, the lower surface 411 of the base substrate 41 is set as the active surface. However, the present embodiment is not for limitation purposes. The upper surface 412 of the base substrate 41 may be set as the active surface. By setting the upper surface 412 of the base substrate 41 as the active surface, the resonator device 1 and the oscillation circuit 48 can be electrically coupled at a lower impedance, and an oscillator can perform more stable oscillation.

Fourth Embodiment

Figure 20:
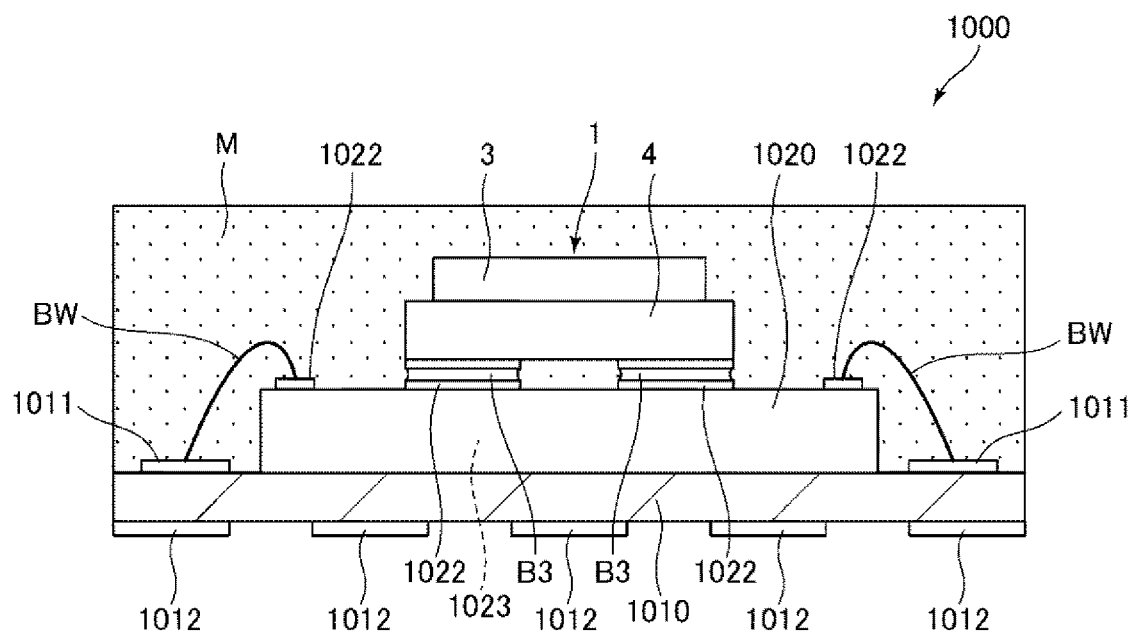
FIG. 20 is a sectional view illustrating a resonator module according to a fourth embodiment.

FIG. 20 is a sectional view illustrating a resonator module according to a fourth embodiment.

A resonator module 1000 illustrated in FIG. 20 includes a support substrate 1010, a circuit substrate 1020 mounted on the support substrate 1010, the resonator device 1 mounted on the circuit substrate 1020, and a mold material M molding the circuit substrate 1020 and the resonator device 1.

For example, the support substrate 1010 is an interposer substrate. A plurality of coupling terminals 1011 are arranged on the upper surface of the support substrate 1010. A plurality of mount terminals 1012 are arranged on the lower surface of the support substrate 1010. An internal interconnect, not illustrated, is arranged in the support substrate 1010. Each coupling terminal 1011 is electrically coupled to the corresponding mount terminal 1012 through the internal interconnect. The support substrate 1010 is not particularly limited. For example, a silicon substrate, a ceramic substrate, a resin substrate, a glass substrate, or a glass epoxy substrate can be used.

The circuit substrate 1020 is bonded to the upper surface of the support substrate 1010 through a die attaching material. In the circuit substrate 1020, an oscillation circuit 1023 that generates the frequency of a reference signal such as a clock signal by oscillating the resonator element 5 of the resonator device 1 is formed. A plurality of terminals 1022 electrically coupled to the oscillation circuit are arranged on the upper surface of the oscillation circuit 1023. A part of the terminals 1022 is electrically coupled to the coupling terminals 1011 through bonding wires BW. A part of the terminals 1022 are electrically coupled to the resonator device 1 through a conductive bonding member B3 such as solder.

The mold material M molds the circuit substrate 1020 and the resonator device 1 and protects the circuit substrate 1020 and the resonator device 1 from moisture, dust, shock, and the like. The mold material M is not particularly limited. For example, a thermosetting type epoxy resin can be used, and the molding can be performed using a transfer molding method.

The resonator module 1000 includes the resonator device 1. Thus, the effect of the resonator device 1 can be accomplished, and excellent reliability can be exhibited.

Fifth Embodiment

Figure 21:
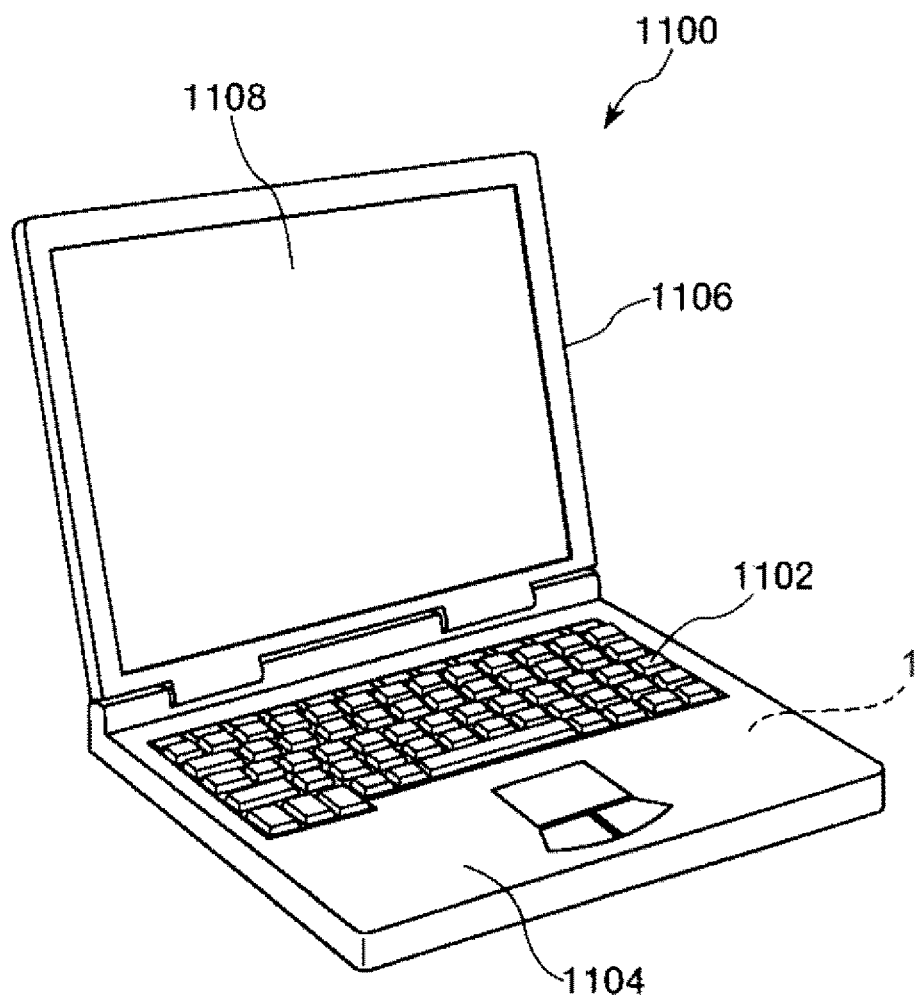
FIG. 21 is a perspective view illustrating an electronic apparatus according to a fifth embodiment.

FIG. 21 is a perspective view illustrating an electronic apparatus according to a fifth embodiment.

The electronic apparatus including the resonator device of the present application example is applied to a laptop type personal computer 1100 illustrated in FIG. 21. In FIG. 21, the personal computer 1100 is configured with a main body portion 1104 including a keyboard 1102, and a display unit 1106 including a display 1108. The display unit 1106 is pivotably supported with respect to the main body portion 1104 through a hinge structure. For example, the resonator device 1 used as an oscillator is incorporated in the personal computer 1100.

The personal computer 1100 as the electronic apparatus includes the resonator device 1. Thus, the effect of the resonator device 1 can be accomplished, and high reliability can be exhibited.

Sixth Embodiment

Figure 22:
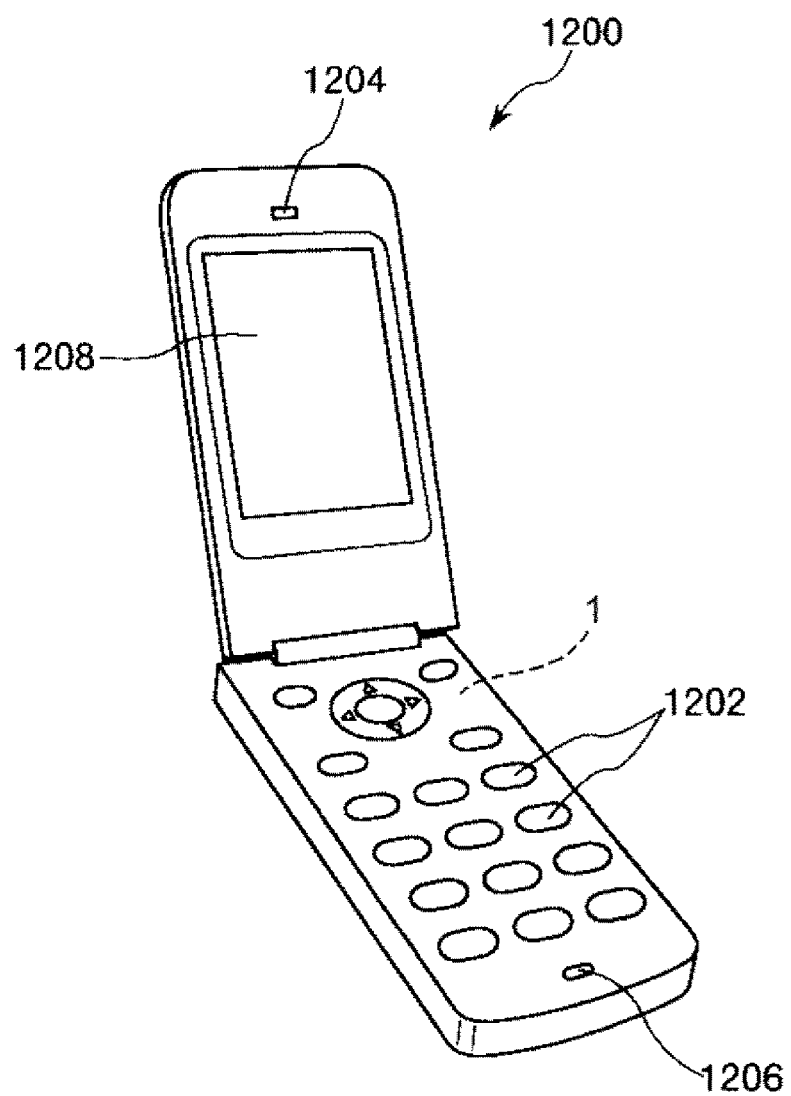
FIG. 22 is a perspective view illustrating an electronic apparatus according to a sixth embodiment.

FIG. 22 is a perspective view illustrating an electronic apparatus according to a sixth embodiment.

The electronic apparatus including the resonator device of the present application example is applied to a mobile phone 1200 illustrated in FIG. 22. The mobile phone 1200 includes an antenna, a plurality of operation buttons 1202, a receiver 1204, and a transmitter 1206. A display 1208 is arranged between the operation buttons 1202 and the receiver 1204. For example, the resonator device 1 used as an oscillator is incorporated in the mobile phone 1200.

The mobile phone 1200 as the electronic apparatus includes the resonator device 1. Thus, the effect of the resonator device 1 can be accomplished, and high reliability can be exhibited.

Seventh Embodiment

Figure 23:
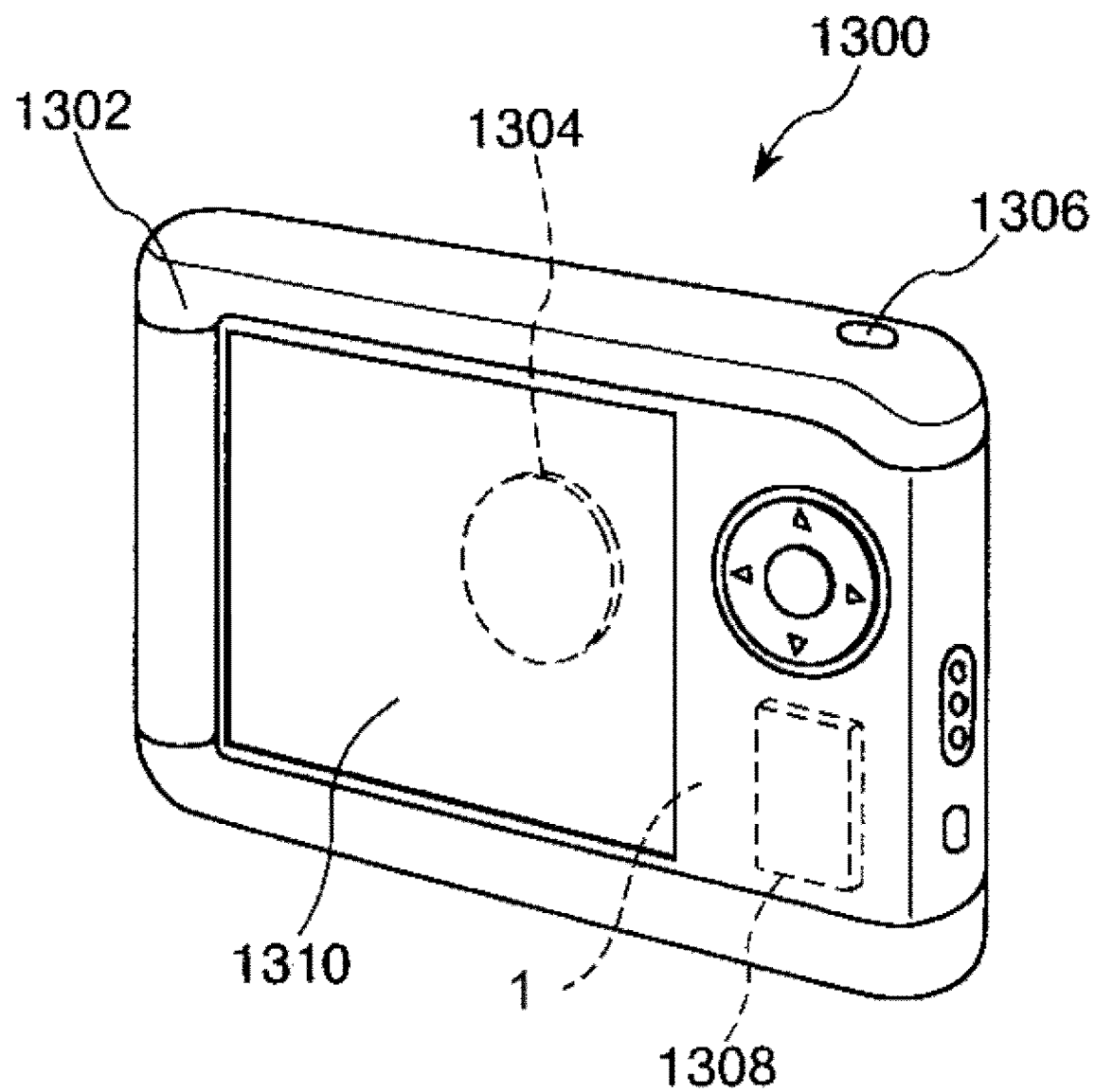
FIG. 23 is a perspective view illustrating an electronic apparatus according to a seventh embodiment.

FIG. 23 is a perspective view illustrating an electronic apparatus according to a seventh embodiment.

The electronic apparatus including the resonator device of the present application example is applied to a digital still camera 1300 illustrated in FIG. 23. A display 1310 is disposed on the rear surface of a body 1302 and is configured to perform displaying based on an imaging signal of a CCD. The display 1310 functions as a finder that displays a subject as an electronic image. A light reception unit 1304 that includes an optical lens, a CCD, and the like is disposed on the front surface side (in FIG. 24, the rear surface side) of the body 1302. When a person performing imaging checks the subject image displayed on the display 1310 and presses a shutter button 1306, the imaging signal of the CCD at that time point is transferred to and stored in a memory 1308. For example, the resonator device 1 used as an oscillator is incorporated in the digital still camera 1300.

The digital still camera 1300 as the electronic apparatus includes the resonator device 1. Thus, the effect of the resonator device 1 can be accomplished, and high reliability can be exhibited.

In addition to the personal computer, the mobile phone, and the digital still camera, for example, the electronic apparatus of the present application example can be applied to a smartphone, a tablet terminal, a timepiece (including a smart watch), an ink jet type ejecting apparatus (for example, an ink jet printer), a laptop type personal computer, a television, a wearable terminal such as a head-mounted display (HMD), a video camera, a video tape recorder, a car navigation apparatus, a pager, an electronic organizer (including an electronic organizer having a communication function), an electronic dictionary, an electronic calculator, an electronic game apparatus, a word processor, a workstation, a videophone, a security television monitor, an electronic binocular, a POS terminal, a medical apparatus (for example, an electronic thermometer, a blood pressure meter, a blood glucose meter, an electrocardiograph, an ultrasound diagnosis apparatus, and an electronic endoscope), a fishfinder, various measuring apparatuses, a mobile terminal base station apparatus, meters (for examples, meters of a vehicle, an aircraft, and a ship), a flight simulator, a network server, and the like.

Eighth Embodiment

Figure 24:
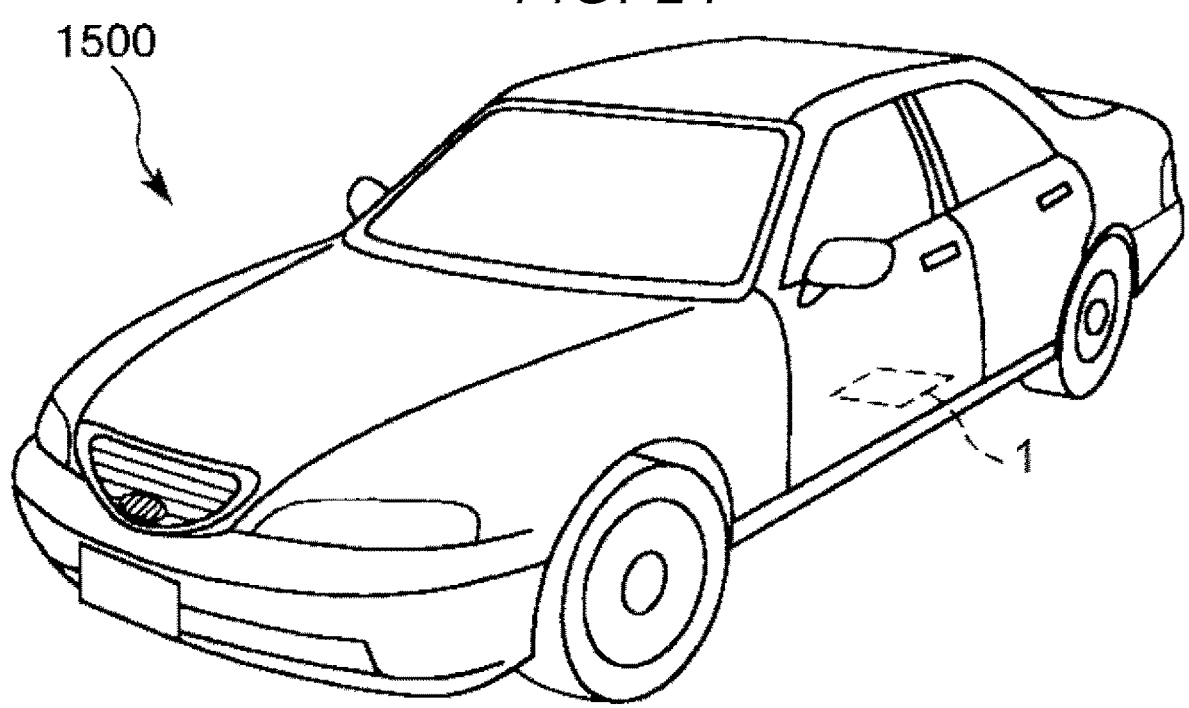
FIG. 24 is a perspective view illustrating a vehicle according to an eighth embodiment.

FIG. 24 is a perspective view illustrating a vehicle according to an eighth embodiment.

An automobile 1500 illustrated in FIG. 24 is an automobile to which the vehicle including the resonator device of the present application example is applied. For example, the resonator device 1 used as an oscillator is incorporated in the automobile 1500. The resonator device 1 can be widely applied to keyless entry, an immobilizer, a car navigation system, a car air conditioner, an antilock brake system (ABS), an airbag, a tire pressure monitoring system (TPMS), engine control, a battery monitor of a hybrid automobile or an electric automobile, and an electronic control unit (ECU) such as a vehicle attitude control system.

The automobile 1500 as the vehicle includes the resonator device 1. Thus, the effect of the resonator device 1 can be accomplished, and high reliability can be exhibited.

The vehicle is not limited to the automobile 1500 and can be applied to an airplane, a ship, an unmanned transport vehicle (AGV), a biped robot, an unmanned airplane such as a drone, and the like.

While the resonator device, the resonator module, the electronic apparatus, the vehicle, and the manufacturing method for the resonator device according to the present application example are described thus far based on the illustrated embodiments, the present application example is not limited to the embodiments. The configuration of each unit can be replaced with any configuration having the same function. Any other constituents may be added to the present application example. The present application example may be a combination of any two or more configurations in each of the embodiments.

What is claimed is:

1. A resonator device comprising:
   a base substrate that is formed of a single crystal semiconductor and includes a first surface;
   a resonator element attached to the first surface of the base substrate; and
   a cover including a second surface bonded to the first surface of the base substrate, that accommodates the resonator element between the cover and the base substrate, and is formed of a single crystal semiconductor, wherein
   the base substrate and the cover are bonded through an amorphous layer, and
   wherein the amorphous layer is formed by bonding the first surface and the second surface activated by breaking a crystal structure of the single crystal semiconductor.

2. The resonator device according to claim 1, wherein a material of the base substrate and a material of the cover are the same.

3. The resonator device according to claim 2, wherein the single crystal semiconductor is single crystal silicon.

4. The resonator device according to claim 1, wherein the cover includes a recess portion having an opening, the resonator element is accommodated in the recess portion, and
   the opening is closed with the base substrate.

5. The resonator device according to claim 1, wherein a bonding area between the base substrate and the cover is positioned inside an outer edge of the first surface.

6. The resonator device according to claim 1, wherein the base substrate includes a recess portion having an opening,
   the resonator element is accommodated in the recess portion, and
   the opening of the recess portion is closed with the cover.

7. The resonator device according to claim 6, wherein the base substrate includes a third surface in a front-rear relationship with the first surface and a side surface coupling the first surface to the third surface, and
   in plan view of the base substrate, the side surface includes a part positioned outside an outer edge of the first surface.

8. A resonator module comprising:
   the resonator device according to claim 1; and
   an oscillation circuit oscillating the resonator element.

9. An electronic apparatus comprising:
   the resonator device according to claim 1.

10. A vehicle comprising:
    the resonator device according to claim 1.

* * * * *